United States Patent
Gotoh et al.

(10) Patent No.: US 7,732,945 B2
(45) Date of Patent: Jun. 8, 2010

(54) RECTIFIER CIRCUIT

(75) Inventors: Kunihiko Gotoh, Kawasaki (JP);
Daisuke Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 11/062,831

(22) Filed: Feb. 23, 2005

(65) Prior Publication Data

US 2006/0076837 A1  Apr. 13, 2006

(30) Foreign Application Priority Data

Sep. 30, 2004  (JP) .............................. 2004-287606

(51) Int. Cl.
*H03K 3/00* (2006.01)
*H03K 3/64* (2006.01)
(52) U.S. Cl. ..................................................... 307/107
(58) Field of Classification Search .................. 307/107, 307/112
See application file for complete search history.

(56) References Cited

U.S. PATENT DOCUMENTS

| | | | | |
|---|---|---|---|---|
| 6,060,943 | A | 5/2000 | Jansen | 327/538 |
| 6,078,512 | A * | 6/2000 | Bouvier | 363/127 |
| 6,421,261 | B1 * | 7/2002 | Fujisawa et al. | 363/127 |
| 6,747,880 | B2 * | 6/2004 | Grover | 363/21.06 |

FOREIGN PATENT DOCUMENTS

| | | |
|---|---|---|
| EP | 1 071 211 A1 | 1/2001 |
| JP | 59-111514 A | 6/1984 |
| JP | 59-228770 A | 12/1984 |
| JP | 2002-152080 A | 5/2002 |
| JP | 2003-348773 A | 12/2003 |
| WO | WO 2004/077190 A1 | 9/2004 |

OTHER PUBLICATIONS

Karthaus et al., "Fully Integrated Passive UHF RFID Transponder IC with 16.7-uW Minimum RF Input Power", IEEE Journal of Solid-State Circuits, vol. 38, No. 10, pp. 1602-1608 (Oct. 2003).
Nantoh, "Electronic Circuit and Analogue IC", Kougatosho Ltd., p. 174-175.

* cited by examiner

*Primary Examiner*—Fritz M Fleming
*Assistant Examiner*—Carlos Amaya
(74) *Attorney, Agent, or Firm*—Arent Fox LLP

(57) ABSTRACT

Disclosed is a rectifier circuit that realizes a low threshold voltage without using a process step to enable reduction in cost and in variation of devices. An NMOS transistor has a threshold voltage. In the transistor, a voltage to be rectified is inputted to a second node, and a rectified voltage is outputted to a first node. A threshold voltage generator is connected to a gate of the transistor and the first node. The generator generates a voltage and outputs it to the gate of the transistor. The voltage is a voltage which is elevated by the threshold voltage with respect to a voltage of the first node and is decreased by a microvoltage sufficiently small with respect to the threshold voltage. Thus, when the voltage of the second node is decreased by the microvoltage or more with respect to that of the first node, the transistor is turned on.

5 Claims, 18 Drawing Sheets

RECTIFIER CIRCUIT

CROSS-REFERENCE TO RELATED APPLICATIONS

This application is based upon and claims the benefits of priority from the prior Japanese Patent Application No. 2004-287606, filed on Sep. 30, 2004, the entire contents of which are incorporated herein by reference.

BACKGROUND OF THE INVENTION

1. Field of the Invention

The present invention relates to a rectifier circuit, and particularly to a rectifier circuit for rectifying a voltage.

2. Description of the Related Art

At present, importance of rectifier circuits that operate at a low voltage is growing with a tendency toward compact and portable systems. Such rectifier circuits are used, for example, in IC cards or ID chips which cannot contain a battery as a power supply. In the IC cards or ID chips, an electric power is taken out from radio wave radiation energy, and voltage reduction is prevented by the rectifier circuits that operate at a low voltage, whereby a wider communicable range is realized. A diode or Metal Oxide Semiconductor (MOS) transistor that is turned on and off according to the magnitude relation in voltages between two terminals is used in the rectifier circuit (see, e.g., Udo Karthaus et al., "Fully Integrated Passive UHF RFID Transponder IC with 16.7-uW Minimum RF Input Power", IEEE J. Solid-State Circuits, Vol.38, No. 10, p.1602-1608, October 2003, Yasuo Nantoh, "Electronic Circuit and Analogue IC", p.174, Kougakutosho Ltd.).

FIG. 17 is a circuit diagram of a diode-connected NMOS transistor. As shown in the diagram, a gate and a drain are connected in an NMOS transistor M101. Herein, a voltage of the drain is designated as a voltage Va, a voltage of the source is designated as a voltage Vb, and a threshold voltage of the transistor M101 is designated as a threshold voltage Vthn. In this case, when the following formula (1) is satisfied, a current flows from the drain to the source.

$$Va \geq Vb + Vthn \quad (1)$$

More specifically, when the voltage Va of the drain is higher than the voltage Vb of the source by the threshold voltage Vthn, the transistor M101 is turned on and a current is allowed to flow. On the other hand, when the voltage Va of the drain is not higher than the voltage Vb of the source by the threshold voltage Vthn, the transistor M101 is turned off and no current is allowed to flow.

FIG. 18 is a circuit diagram of a diode-connected PMOS transistor. As shown in the diagram, a gate and a drain are connected in a PMOS transistor M102. Herein, a voltage of the source is designated as a voltage Va, a voltage of the drain is designated as a voltage Vb, and a threshold voltage of the transistor M102 is designated as a threshold voltage Vthp. In this case, when the following formula (2) is satisfied, a current flows from the source to the drain.

$$Va \geq Vb + Vthp \quad (2)$$

More specifically, when the voltage Va of the source is higher than the voltage Vb of the drain by the threshold voltage Vthp, the transistor M102 is turned on and a current is allowed to flow. On the other hand, when the voltage Va of the source is not higher than the voltage Vb of the drain by the threshold voltage Vthp, the transistor M102 is turned off and no current is allowed to flow.

In a diode, when a voltage of an anode is higher than one of a cathode by a forward voltage Vf or more, a current is allowed to flow.

As described above, since the threshold voltage for turning on a switch (transistor or diode) is present in the rectifier circuit, a conduction loss occurs during the rectification. This conduction loss can be improved by reducing the threshold voltage. Further, it means that accuracy of the determination of whether a switch is turned on/off at the input of a small signal can be improved by reducing the threshold voltage. For reducing the threshold voltage, a schottky diode having a low forward voltage and a MOS transistor having a low threshold voltage are used.

However, when configuring the rectifier circuit by employing a semiconductor integrated circuit, the following problems arise. The schottky diode or the MOS transistor having a low threshold voltage is realized by addition of process steps and as a result, costs are increased.

In addition, the diode or the transistor is different from other diodes or MOS transistors in the manufacturing process and therefore, variation in the devices is caused.

SUMMARY OF THE INVENTION

In view of the foregoing, it is an object of the present invention to provide a rectifier circuit that realizes a low threshold voltage without using a process step so as to enable reduction in costs and in variation of devices.

To accomplish the above object, according to the present invention, there is provided a rectifier circuit for rectifying a voltage. This rectifier circuit comprises a transistor, and a threshold voltage generator that outputs a voltage near a threshold voltage to a gate of the transistor, the voltage near the threshold voltage being based on one of two nodes serving as a drain and a source.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
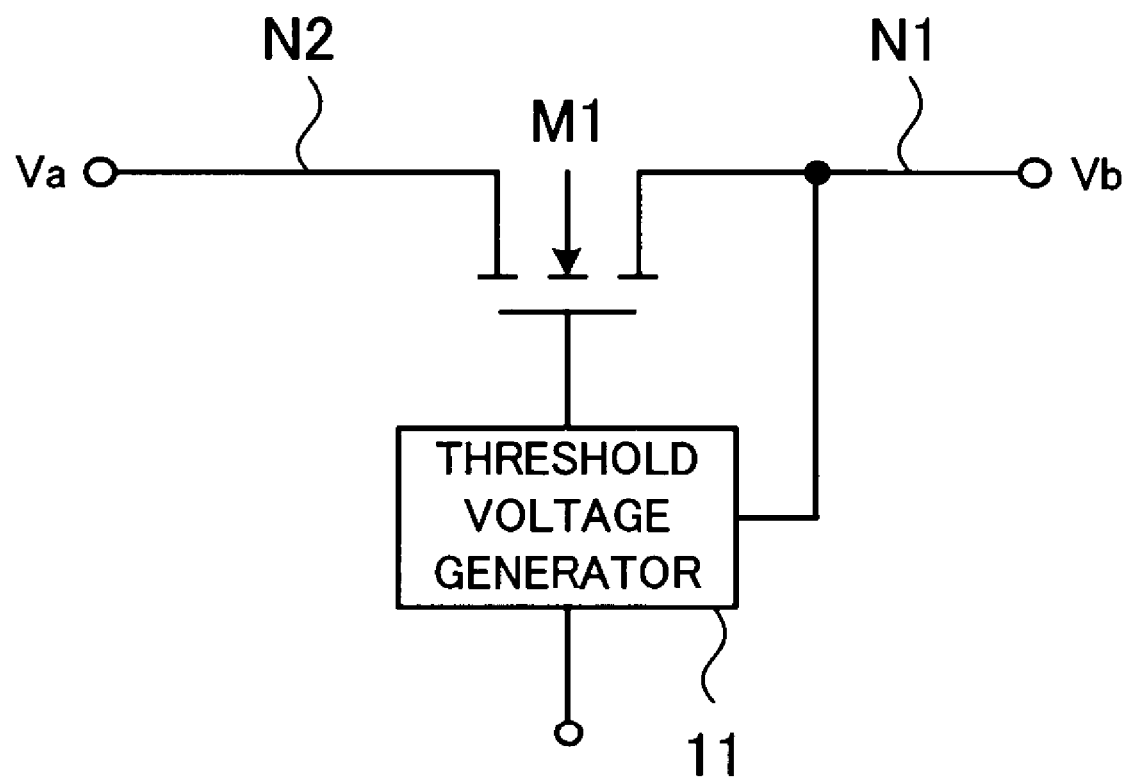
FIG. 1 is a circuit diagram of a rectifier circuit according to a first embodiment of the present invention.

A first embodiment of the present invention will be described in detail below with reference to the accompanying drawings, wherein like reference numerals refer to like elements throughout.

FIG. 1 is a circuit diagram of a rectifier circuit according to the first embodiment of the present invention. An NMOS transistor M1 shown in the diagram has a threshold voltage Vthn1. Nodes N1 and N2 serve as a drain and source of the transistor M1. A voltage Va to be rectified is inputted to the node N2 and a rectified voltage Vb is outputted to the node N1.

A threshold voltage generator 11 is connected to a gate of the transistor M1 and the node N1. The threshold voltage generator 11 generates a voltage Vth1 and outputs it to the gate of the transistor M1. The voltage Vth1 is a voltage which is elevated by the threshold voltage Vthn1 with respect to a voltage of the node N1 and is decreased by a voltage ΔVthn sufficiently small with respect to the threshold voltage Vthn1.

In this circuit, when the voltage Va is lower than the voltage Vb, an electron flows from the node 2 to the node 1. Therefore, the node N2 serves as the source. Therefore, when the voltage at the gate of the transistor M1 is higher than the voltage Va of the node N2 by the threshold voltage Vthn1, the transistor M1 is turned on to allow a current to flow from the node N1 to the node N2. As described above, to the gate of the transistor M1, the voltage Vth1 is inputted, which is higher than the voltage of the node N1 by the threshold voltage Vthn1 of the transistor M1 and is lower than the threshold voltage Vthn1 by the voltage ΔVthn. Therefore, when the voltage Va is lower than the voltage Vb by the voltage ΔVthn, the transistor M1 is turned on. More specifically, when the voltage Va is lower than the voltage Vb by the voltage ΔVthn or more, a voltage equal to or more than the threshold voltage Vthn1 is applied to the node N2 and the gate of the transistor M1. As a result, the transistor Ml is turned on.

On the other hand, when the voltage Va is higher than the voltage Vb, an electron flows from the node N1 to the node N2. Therefore, the node N1 serves as the source. To the gate of the transistor M1, the threshold voltage generator 11 inputs the voltage Vth1 which is higher than a voltage of the node N1 by the threshold voltage Vthn1 of the transistor M1 and is lower than the threshold voltage Vthn1 by the voltage ΔVthn. Therefore, the transistor M1 is not turned on.

As described above, the circuit is designed such that to the gate of the transistor M1, the threshold voltage generator 11 inputs the voltage Vth1 which is lower than the threshold voltage Vthn1 by the voltage ΔVthn. Therefore, the threshold voltage Vthn1 can be reduced to the voltage ΔVthn not by a process step but by the circuit for generating a voltage. As a result, the cost and the variation in devices can be reduced. As the voltage ΔVthn is smaller, the threshold voltage that turns on the transistor M1 is more reduced.

The threshold voltage generator 11 is described in detail.

Figure 2:
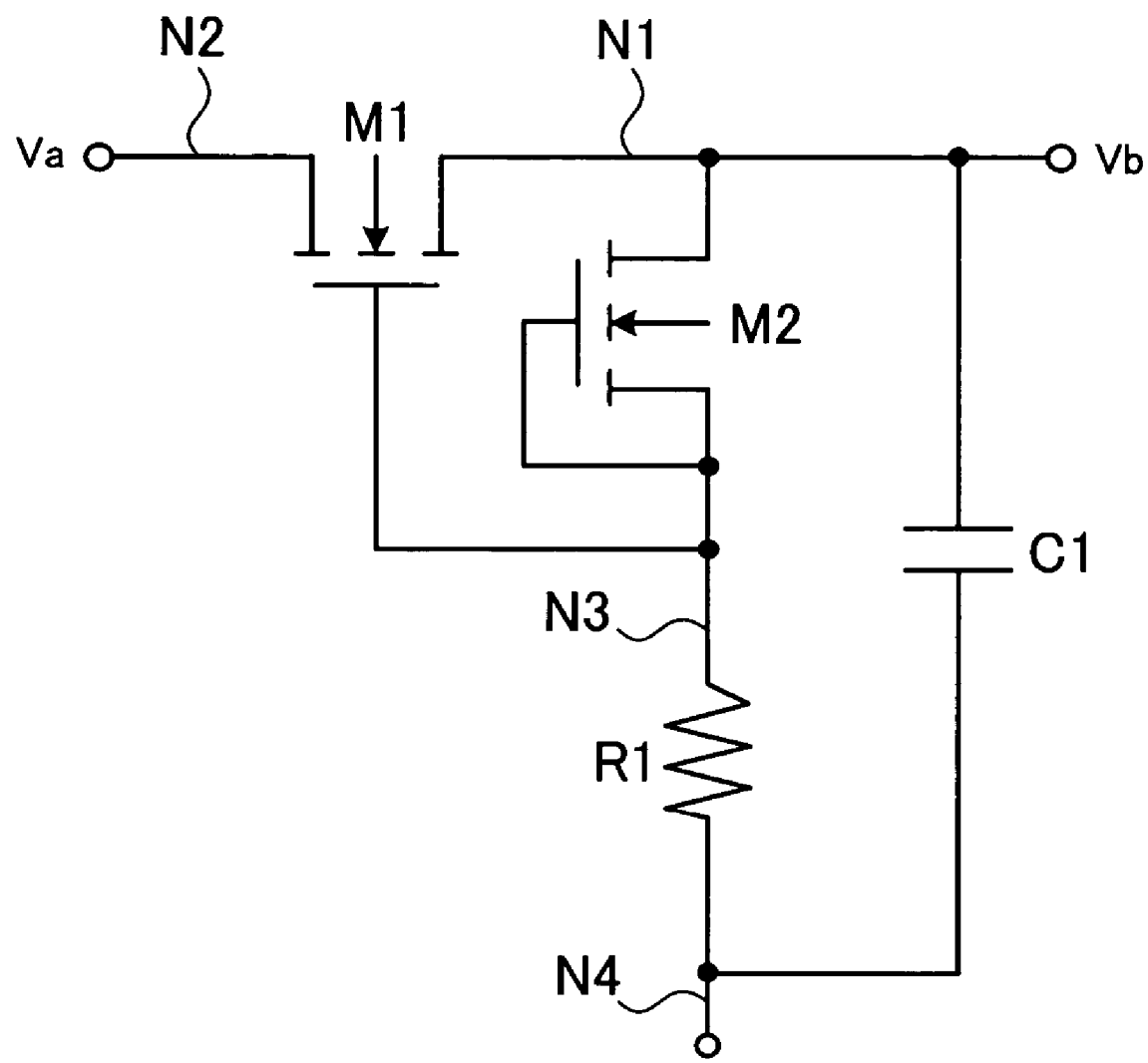
FIG. 2 is a detailed circuit diagram of a threshold voltage generator of FIG. 1.

FIG. 2 is a detailed circuit diagram of the threshold voltage generator of FIG. 1. In the diagram, the same elements as those in FIG. 1 are indicated by the same reference numerals as in FIG. 1 and their descriptions are omitted. As shown in the diagram, a series circuit of a diode-connected NMOS transistor M2 and a resistor R1 is connected to the node N1. A connection point of the transistor M2 and the resistor R1 is connected to the gate of the transistor M1. A capacitor C1 for keeping the rectified voltage Vb constant is connected in parallel to the series circuit of the transistor M2 and the resistor RI. The connection point of the transistor M2 and the resistor R1 is designated as a node N3. An end of the resistor R1, which is not connected to the transistor M2, is designated as a node N4. The rectifier circuit shown in the diagram is formed into one semiconductor integrated circuit. In the transistors M1 and M2, gate lengths and gate widths are formed so that the threshold voltage Vthn1 of the transistor M1 may be a little larger than the threshold voltage Vthn2 of the transistor M2 (larger than the Vthn2 by the voltage ΔVthn). The transistors M1 and M2 are almost the same in values of the threshold voltages Vthn1 and Vthn2 and therefore, are almost the same also in the gate length and the gate width. As a result, the transistors M1 and M2 can be formed by the same process step.

A voltage higher than that of the node N1 is applied to the node N4 so that the transistor M2 may be turned on. By doing so, a current flows from the node N4 to the node N1. As a result, the voltage of the node N3 is elevated by the threshold voltage Vthn2 with respect to that of the node N1 by means of the diode-connected transistor M2. Further, a voltage higher than that of the node N1 by the threshold voltage Vthn2 is inputted to the gate of the transistor M1.

When the voltage Va of the node N2 is lower than the voltage Vb of the node N1 by the voltage ΔVthn, a potential difference of the threshold voltage Vthn1 is applied between the node N2 and the gate of the transistor M1. By doing so, the transistor M1 is turned on and as a result, the threshold voltage Vthn1 of the transistor M1 can be reduced to the voltage ΔVthn.

Operations in FIG. 2 are described using specific values. Assume that the threshold voltage Vthn1 of the transistor M1 and the threshold voltage Vthn2 of the transistor M2 are 0.6 volt and 0.5 volt, respectively. Also, assume that the voltage Vb is 0 volt and that the voltage ΔVthn is 0.1 volt.

When the voltage Va of the node N2 is equal to or less than −0.1 volt, an electron flows from the node N2 to the node N1. Therefore, the node N2 serves as the source. Since a voltage of 0.5 volt is inputted to the gate of the transistor M1 by the diode-connected transistor M2, a potential difference between the node N2 and the gate of the transistor M1 is equal to or more than 0.6 volt. As a result, the transistor M1 is turned on and a current is allowed to flow from the node N1 to the node N2.

On the other hand, when the voltage Va is from −0.1 to 0 volt, the potential difference between the node N2 and the gate of the transistor M1 is smaller than the threshold voltage Vthn1 of 0.6 volt. As a result, the transistor M1 is turned off. Further, when the voltage Va is larger than 0 volt, an electron flows from the node N1 to the node N2. Therefore, the node N1 serves as the source. With respect to a voltage of the node N1 of 0 volt, a voltage of 0.5 volt is inputted to the gate of the transistor M1 by the transistor M2. Therefore, the transistor M1 is in an off-state.

As described above, even if the voltage of the node N2 fails in decreasing to 0.6 volt or more lower than the voltage of the node N1, when the voltage ΔVthn decreases by 0.1 volt or more, the transistor M1 is turned on. Thus, the threshold voltage that turns on the transistor M1 can be reduced.

Figure 3:
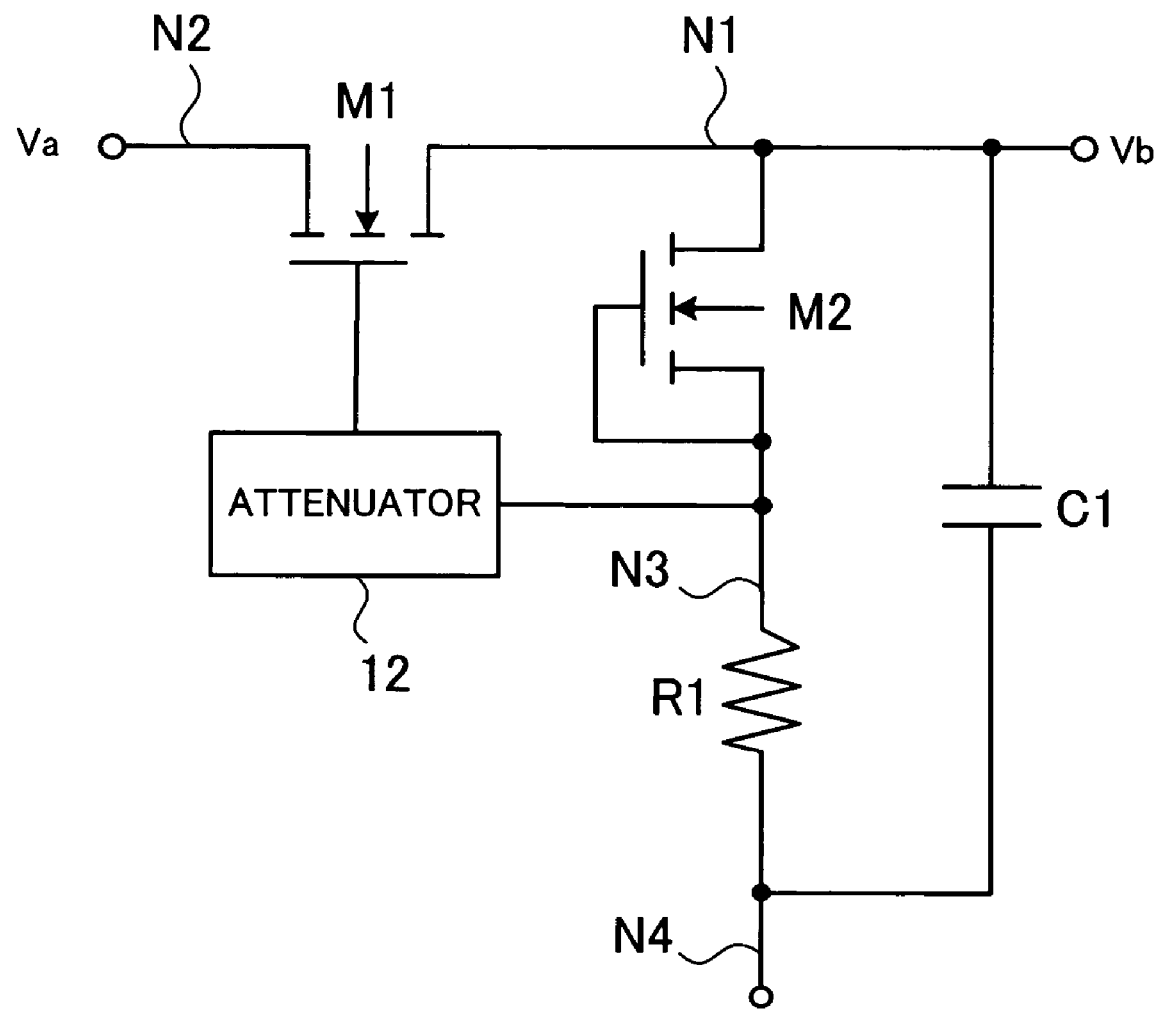
FIG. 3 is a circuit diagram where an attenuator is added to the circuit of FIG. 2.

FIG. 3 is a circuit diagram where an attenuator is added to a circuit of FIG. 2. In the diagram, the same elements as those in FIG. 2 are indicated by the same reference numerals as in FIG. 2 and their descriptions are omitted. As shown in the diagram, an attenuator 12 connected to the gate of the transistor M1 is connected to a connection point of the transistor M2 and the resistor R1.

A voltage higher than that of the node N1 is applied to the node N4 so that the transistor M2 may be turned on. By doing so, a current flows from the node N3 to the node N1. As a result, the voltage of the node N3 is elevated by the threshold voltage Vthn2 with respect to that of the node N1 by means of the diode-connected transistor M2. The attenuator 12 attenuates the voltage of the node N3 by a voltage ΔVde and outputs the resulting voltage to the gate of the transistor M1. More specifically, the transistor M1 is turned on when the voltage Va of the node N2 is lower than the voltage Vb of the node N1 by a voltage obtained by addition of the voltage ΔVthn and the voltage ΔVde.

When the threshold voltage Vthn1 of the transistor M1 is fairly close to the threshold voltage Vthn2 of the transistor M2, it is feared that a leakage current flows through the transistor M1. Therefore, when a voltage inputted to the gate of the transistor M1 is attenuated by the attenuator 12, the leakage current can be suppressed and the rectification efficiency can be enhanced.

Operations in FIG. 3 are described by using specific values. Assume that the threshold voltage Vthn1 of the transistor M1 and the threshold voltage Vthn2 of the transistor M2 are 0.6 volt and 0.5 volt, respectively. Assume that the attenuator 12 attenuates the voltage of the node N3 by a voltage of 0.1 volt and outputs the resulting voltage to the gate of the transistor M1. Also, assume that the voltage Vb is 0 volt. Accordingly, the voltage of the node N3 is determined to be 0.5 volt by the transistor M2. To the gate of the transistor M1, a voltage of 0.4 volt is inputted by the attenuator 12.

When the voltage Va of the node N2 is equal to or less than −0.2 volt, an electron flows from the node N2 to the node N1. Therefore, the node N2 serves as the source. Since a voltage of 0.4 volt is inputted to the gate of the transistor M1, a potential difference between the node N2 and the gate of the transistor M1 is equal to or more than 0.6 volt. As a result, the transistor M1 is turned on and a current is allowed to flow from the node N1 to the node N2.

On the other hand, when the voltage Va is from −0.2 to 0 volt, the potential difference between the node N2 and the gate of the transistor M1 is smaller than the threshold voltage Vthn1 of 0.6 volt. As a result, the transistor M1 is turned off. Further, when the voltage Va is larger than 0 volt, an electron flows from the node N1 to the node N2. Therefore, the node N1 serves as the source. With respect to a voltage at the node N1 of 0 volt, a voltage of 0.4 volt is inputted to the gate of the transistor M1 by the transistor M2 and the attenuator 12. Therefore, the transistor M1 is in an off-state.

As described above, in the case of using no attenuator 12, the transistor M1 is turned on when the voltage of the node N2 is lower than that of the node N1 by 0.1 volt or more. On the other hand, in the case of using the attenuator 12 of FIG. 3, the transistor M1 is turned on when the voltage of the node N2 is lower than that of the node N1 by 0.2 volt or more by means of the attenuator 12. More specifically, when the attenuator 12 reduces a voltage inputted to the gate of the transistor M1, a threshold voltage that turns on the transistor M1 can be increased.

When using the attenuator 12, the transistors M1 and M2 can be formed into one semiconductor integrated circuit so as to have the same threshold voltage. This is because the attenuator 12 can determine the threshold voltage that turns on the transistor M1. This leads to facilitation of the design and the manufacture.

The attenuator 12 is described in detail.

Figure 4:
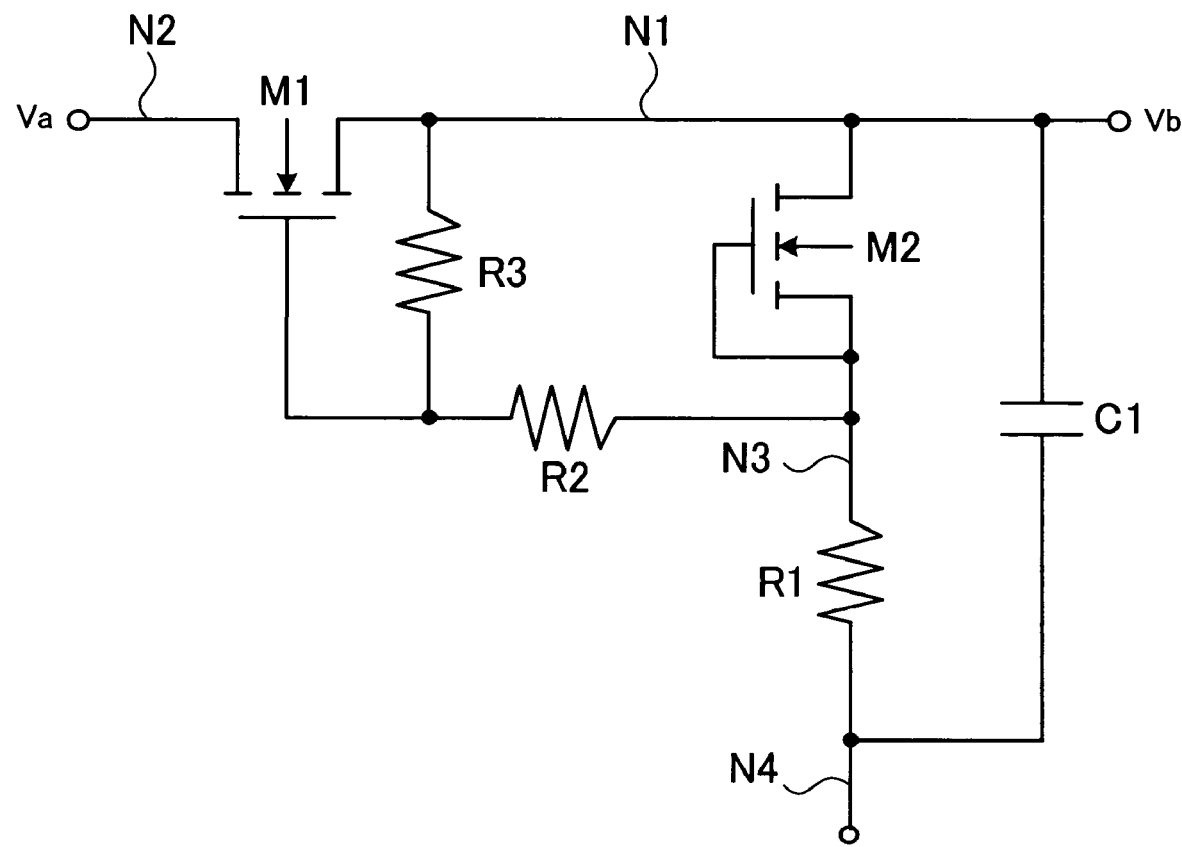
FIG. 4 is a detailed circuit diagram of the attenuator of FIG. 3.

FIG. 4 is a detailed circuit diagram of the attenuator of FIG. 3. In the diagram, the same elements as those in FIG. 3 are indicated by the same reference numerals as in FIG. 3 and their descriptions are omitted. As shown in the diagram, a resistor R2 is connected between the node N3 and the gate of the transistor M1. Further, a resistor R3 is connected between the gate of the transistor M1 and the node N1. The resistors R2 and R3 correspond to the attenuator 12 of FIG. 2.

A current scarcely flows through the gate of the transistor M1. Therefore, the voltage at the gate of the transistor M1 is determined by a resistance ratio between the resistors R2 and R3. For example, in an example of the numerical values described above, the voltage of the node N3 is 0.5 volt and the voltage of the node N1 is 0 volt. Accordingly, the resistance values of the resistors R2 and R3 may be determined such that the voltage at the gate of the transistor M1 becomes 0.4 volt.

By thus dividing the voltage between the node N1 and the node N3 by the resistors R2 and R3, the attenuator 12 can be readily configured. Therefore, the rectifier circuit is readily designed and manufactured.

When the rectifier circuit is applied to an IC card or an ID tag, the voltage Va inputted is extremely reduced depending on the distance between the card or the tag and a reader/writer that supplies power. In this case, in the rectifier circuits shown in FIGS. 3 and 4, the threshold voltage that turns on the transistor M1 is increased by the attenuator 12 and therefore, the voltage Va cannot be rectified in some cases. Accordingly, when the voltage Va inputted is small, the attenuator 12 is inactivated to allow the voltage of the node N3 to be directly inputted to the gate of the transistor M1.

Figure 5:
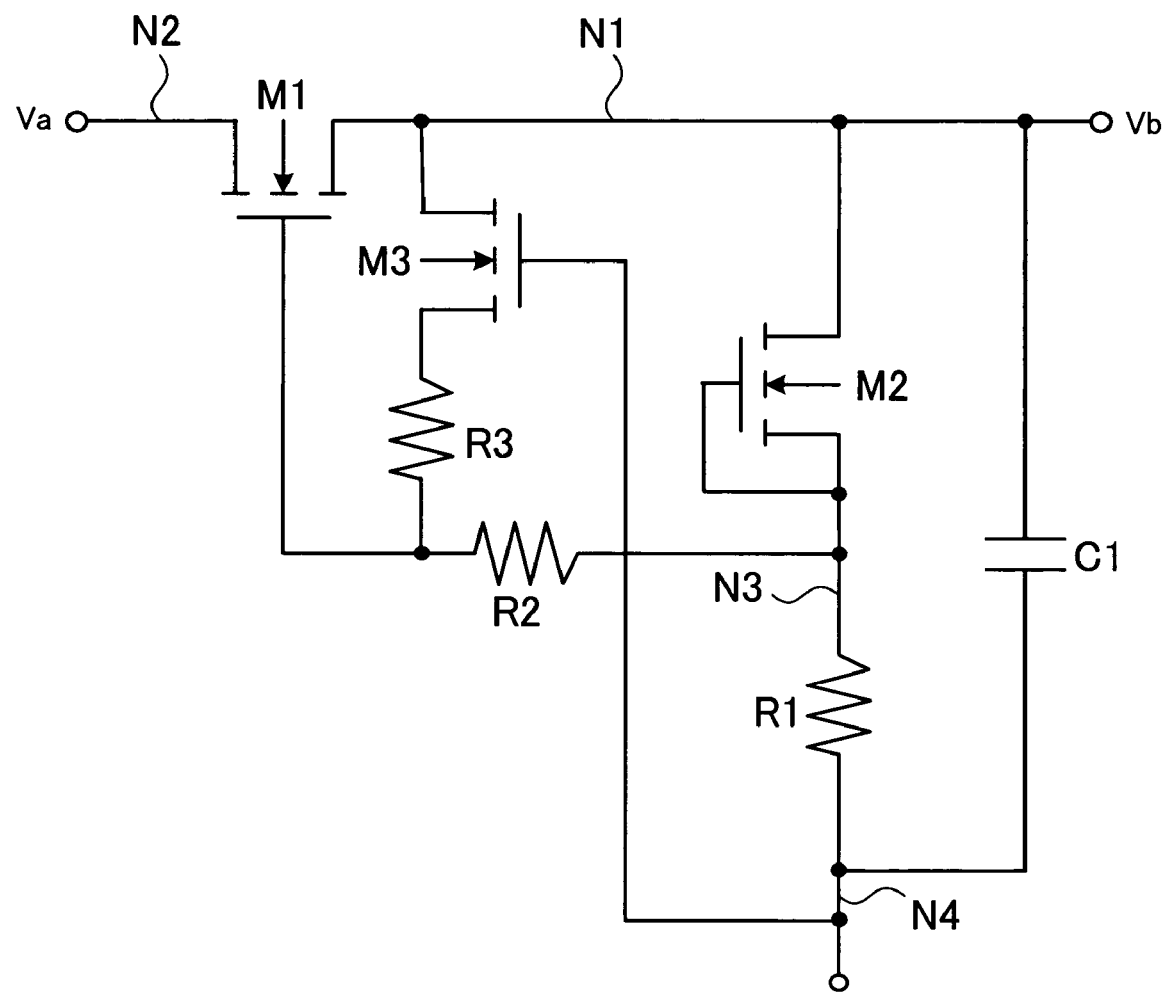
FIG. 5 is a diagram of a circuit for controlling an attenuator.

FIG. 5 is a diagram of a circuit for controlling an attenuator. In the diagram, the same elements as those in FIG. 4 are indicated by the same reference numerals as in FIG. 4 and their descriptions are omitted. As shown in the diagram, an NMOS transistor M3 is connected between the node N1 and the resistor R3. The gate of the transistor M3 is connected to the node N4.

A voltage proportional to the voltage Vb is inputted to the node N4. When the voltage Va is reduced to a voltage that turns off the transistor M1, the transistor M3 is turned off to thereby cut off the connection between the resistor R3 and the node N1. More specifically, when the voltage Va is reduced to a voltage that turns off the transistor M1, the threshold voltage Vthn2 of the diode-connected transistor M2 is inputted to the gate of the transistor M1 without the attenuation. As a result, the threshold voltage that turns on the transistor M1 is reduced. Thus, the voltage Va inputted can be rectified even if it is reduced. In addition, a communicable range of IC cards or ID tags can be widened.

The voltage Vth1 inputted to the gate of the transistor M1 is described below.

Figure 6:
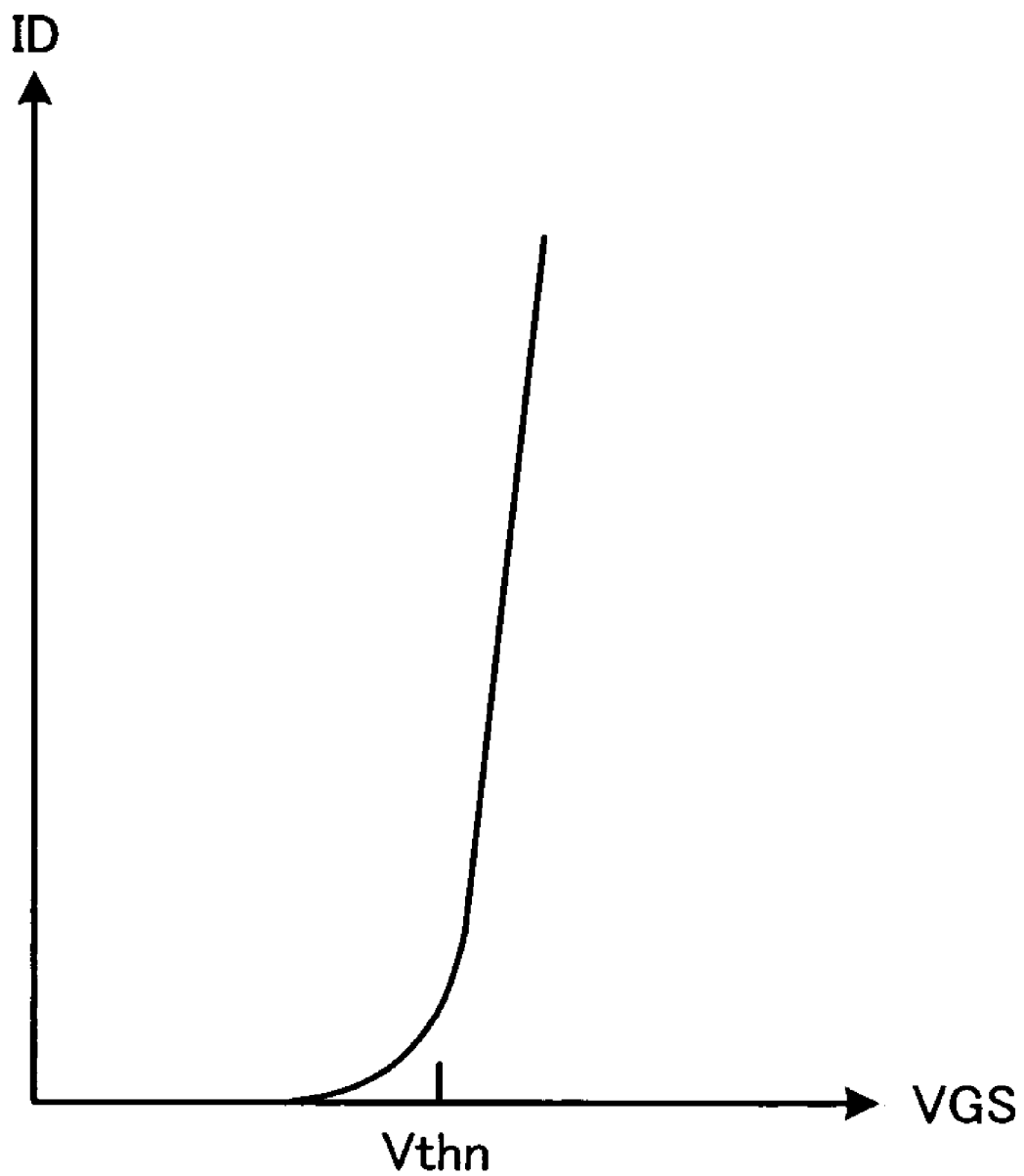
FIG. 6 shows voltage-current characteristics of a diode-connected transistor.

FIG. 6 shows voltage-current characteristics of a diode-connected transistor. In the diagram, a VGS of the horizontal axis shows a voltage between the gate and the source, and an ID of the vertical axis shows a drain current. In the diode-connected transistor, the drain current flows when the VGS exceeds the threshold voltage Vthn as shown in the diagram. Therefore, as shown in FIGS. 1 to 5, a voltage that is lower than the threshold voltage Vthn1 by the voltage ΔVthn is inputted to the gate of the transistor M1 and thereby, a threshold voltage that turns on the transistor M1 is reduced. The voltage inputted to the gate of the transistor M1 is preferably a voltage infinitely close to the threshold voltage Vthn1. However, the voltage is more preferably about 95% of the threshold voltage Vthn1, with a tolerance not to allow the transistor M1 to be turned on due to a leakage current. Further, when the lower limit of the voltage inputted to the gate of the transistor M1 is excessively reduced, the threshold voltage that turns on the transistor M1 is increased. Therefore, the lower limit thereof is preferably about 50% of the threshold voltage Vthn1.

A second embodiment of the present invention will be described in detail below with reference to the accompanying drawings, wherein like reference numerals refer to like elements throughout. The NMOS transistor is described in the first embodiment. Next, a PMOS transistor is described in the second embodiment.

Figure 7:
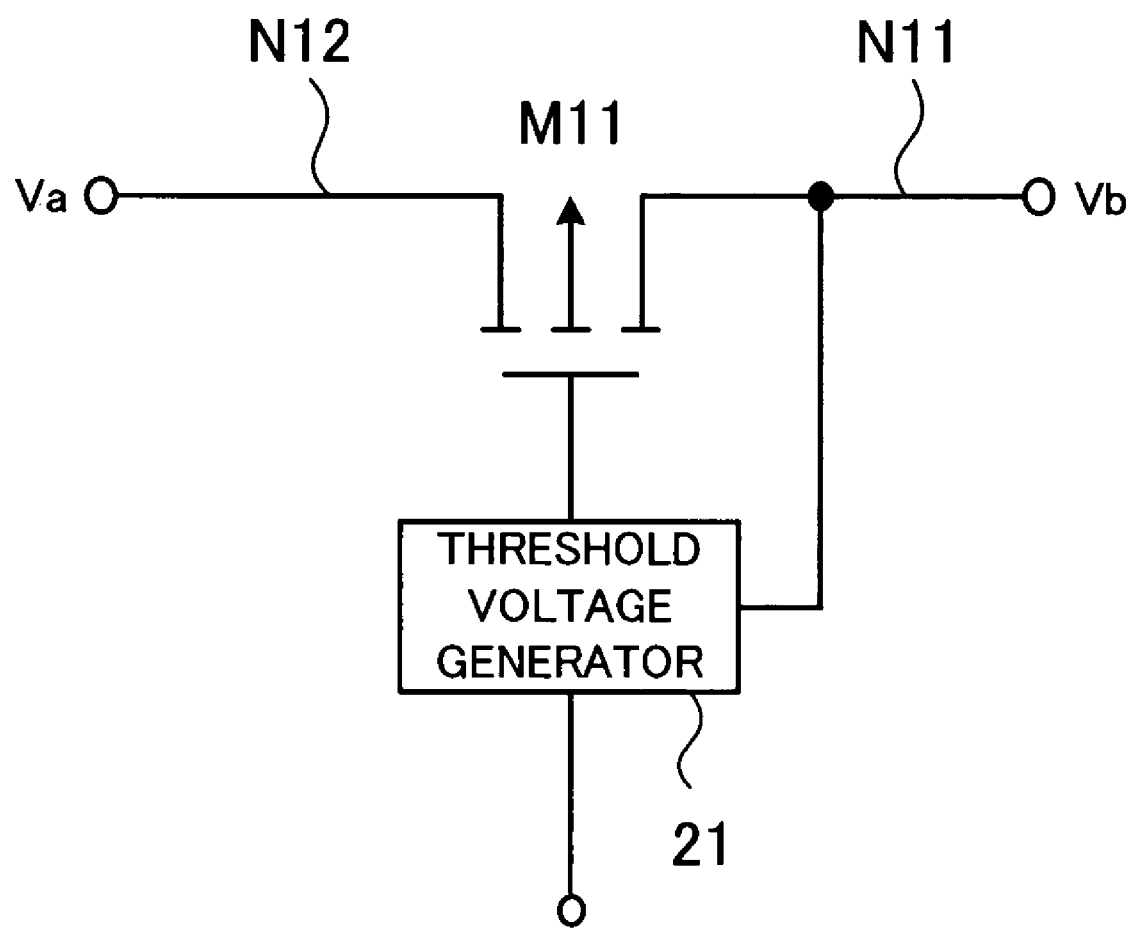
FIG. 7 is a circuit diagram of a rectifier circuit according to a second embodiment of the present invention.

FIG. 7 is a circuit diagram of a rectifier circuit according to the second embodiment of the present invention. A PMOS transistor M11 shown in the diagram has a threshold voltage Vthp1. Nodes N11 and N12 each serve as a drain and source of the transistor M11. The voltage Va to be rectified is inputted to the node N12 and the rectified voltage Vb is outputted to the node N11.

The threshold voltage generator 21 is connected to the gate of the transistor M11 and the node N11. The threshold voltage generator 21 generates a voltage Vthh and outputs it to the gate of the transistor M11. The voltage Vthh is a voltage which is decreased by the threshold voltage Vthp1 with respect to a voltage of the node N11 and is elevated by a voltage ΔVthp sufficiently small with respect to the threshold voltage Vthp1.

In the circuit, when the voltage Va is higher than the voltage Vb, a positive charge flows from the node N12 to the node N11. Therefore, the node N12 serves as the source. Accordingly, when the voltage of the gate of the transistor M11 is lower than the voltage Va of the node N12 by the threshold voltage Vthp1, the transistor M11 is turned on to allow a current to flow from the node N12 to the node N11. As described above, to the gate of the transistor M11, the voltage Vthh is inputted, which is lower than a voltage of the node N11 by the threshold voltage Vthp1 of the transistor M11 and is higher than the threshold voltage Vthp1 by a sufficiently small voltage ΔVthp. When the voltage Va is higher than the voltage Vb by the voltage ΔVthp, the transistor M11 is turned on. More specifically, when the voltage Va is higher than the voltage VB by the voltage ΔVthp or more, a voltage equal to or more than the threshold voltage Vthp1 is applied to the node N12 and the gate of the transistor M11. As a result, the transistor M11 is turned on.

When the voltage Va is lower than the voltage Vb, a positive charge flows from the node N11 to the node N12. Therefore, the node N11 serves as the source. To the gate of the transistor M11, the threshold voltage generator 21 inputs the voltage Vthh which is lower than a voltage of the node N11 by the threshold voltage Vthp1 of the transistor M11 and is higher than the threshold voltage Vthp1 by the voltage ΔVthp. Therefore, the transistor M11 is not turned on.

As described above, the circuit is designed such that to the gate of the transistor M11, the threshold voltage generator 21 inputs the voltage Vthh which is higher than the threshold voltage Vthp1 by the voltage ΔVthp. Therefore, the threshold voltage Vthp1 can be reduced to the voltage ΔVthp not by a process step but by the circuit. As a result, the cost and the variation in devices can be reduced. As the voltage ΔVthp is smaller, the threshold voltage that turns on the transistor M11 is more reduced.

The threshold voltage generator 21 is described in detail.

Figure 8:
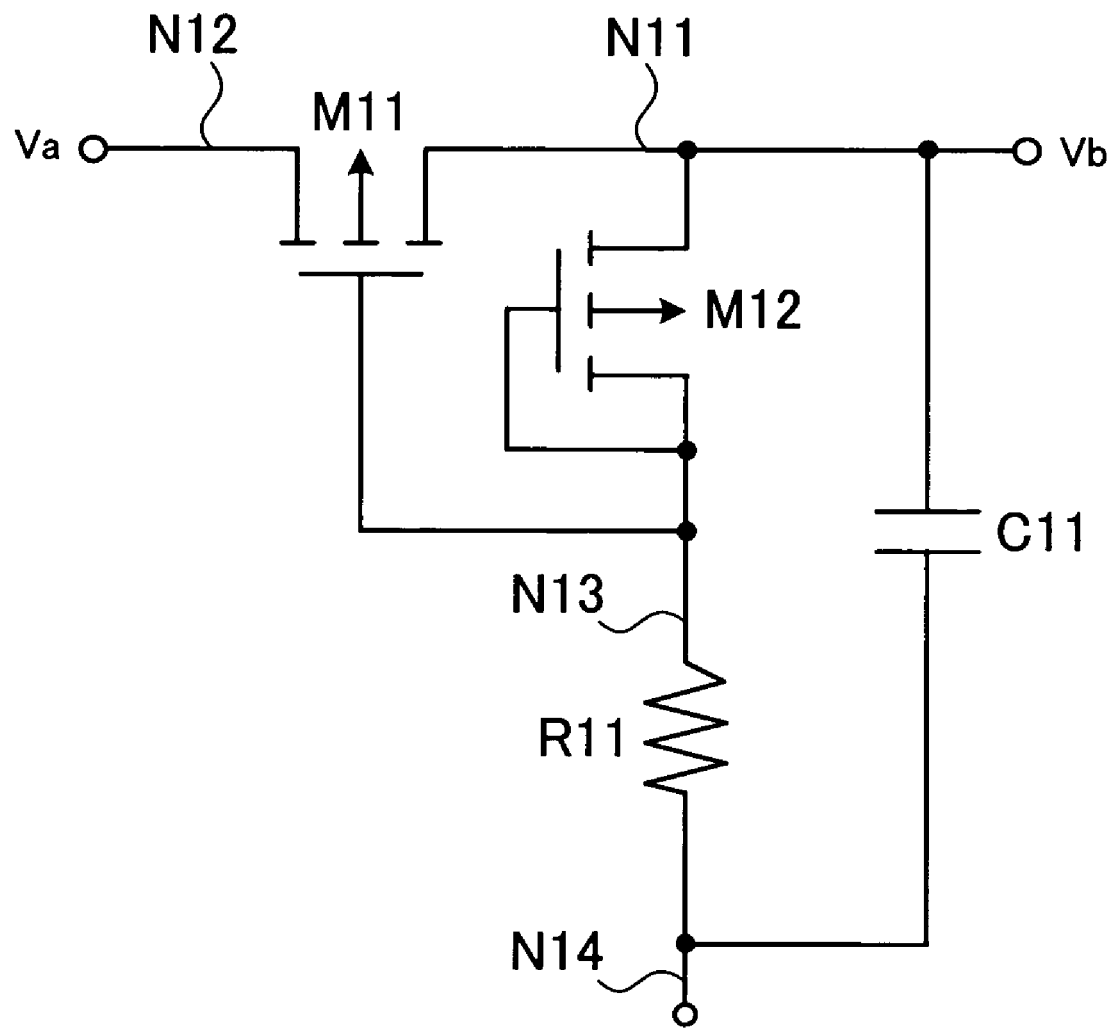
FIG. 8 is a detailed circuit diagram of a threshold voltage generator of FIG. 7.

FIG. 8 is a detailed circuit diagram of a threshold voltage generator of FIG. 7. In the diagram, the same elements as those in FIG. 7 are indicated by the same reference numerals as in FIG. 7 and their descriptions are omitted. As shown in the diagram, a series circuit of a diode-connected PMOS transistor M12 and a resistor R11 is connected to the node N11. A connection point of the transistor M12 and the resistor R11 is connected to the gate of the transistor M11. A capacitor C11 that keeps the rectified voltage Vb constant is connected in parallel to the series circuit of the transistor M12 and the resistor R11. The connection point of the transistor M12 and the resistor R11 is designated as the node N13. An end of the resistor R11, which is not connected to the transistor M12, is designated as a node N14. Further, a rectifier circuit shown in the diagram is formed into one semiconductor integrated circuit. In the transistors M11 and M12, gate lengths and gate widths thereof are formed so that the threshold voltage Vthp1 of the transistor M11 may be a little larger than the threshold voltage Vthp2 of the transistor M12 (larger than the Vthp2 by the voltage ΔVthp). The transistors M11 and M12 are almost the same in values of the threshold voltages Vthp1 and Vthp2 and therefore, are almost the same also in the gate length and the gate width. As a result, the transistors M11 and M12 can be formed by the same process step.

A voltage lower than that of the node N11 is applied to the node N14 so that the transistor M12 may be turned on. By doing so, the current flows from the node N11 to the node N14. As a result, the voltage of the node N13 is decreased by the threshold voltage Vthp2 with respect to that of the node N11 by means of the diode-connected transistor M12. Further, a voltage lower than that of the node N11 by the threshold voltage Vthp2 is inputted to the gate of the transistor M11.

When the voltage Va of the node N12 is higher than the voltage Vb of the node N11 by the voltage ΔVthp, a potential difference of the threshold voltage Vthp1 is applied between the node N12 and the gate of the transistor M11. By doing so, the transistor M11 is turned on, and as a result the threshold voltage Vthp1 of the transistor M11 can be reduced to the voltage ΔVthp.

Operations in FIG. 8 are described by using specific values. Assume that the threshold voltage Vthp1 of the transistor M11 and the threshold voltage Vthp2 of the transistor M12 are 1.1 volts and 1.0 volt, respectively. Also, assume that the voltage Vb is 2 volts and that the voltage ΔVthp is 0.1 volt.

When the voltage Va of the node N12 is equal to or more than 2.1 volts, a positive charge flows from the node N12 to the node N11. Therefore, the node N12 serves as the source. Since a voltage of 1.0 volt is inputted to the gate of the transistor M11 by the diode-connected transistor M12, a potential difference between the node N12 and the gate of the transistor M11 is equal to or more than 1.1 volts. As a result, the transistor M11 is turned on and a current is allowed to flow from the node N12 to the node N11.

On the other hand, when the voltage Va is from 2.1 to 2 volts, the potential difference between the node N12 and the gate of the transistor M11 is smaller than the threshold voltage Vthp1 of 1.1 volts. As a result, the transistor M11 is turned off. Further, when the voltage Va is smaller than 2 volts, a positive charge flows from the node N11 to the node N12. Therefore, the node N11 serves as the source. With respect to the voltage of the node N11 of 2 volts, a voltage of 1.0 volt is inputted to the gate of the transistor M11 by the transistor M12. Therefore, the transistor M11 is in an off-state.

As described above, even if the voltage of the node N12 fails in increasing to 1.1 volts or more higher than the voltage of the node N11, when the voltage ΔVthp increases by 0.1 volt or more, the transistor M11 is turned on. Thus, the threshold voltage that turns on the transistor M11 can be reduced.

Figure 9:
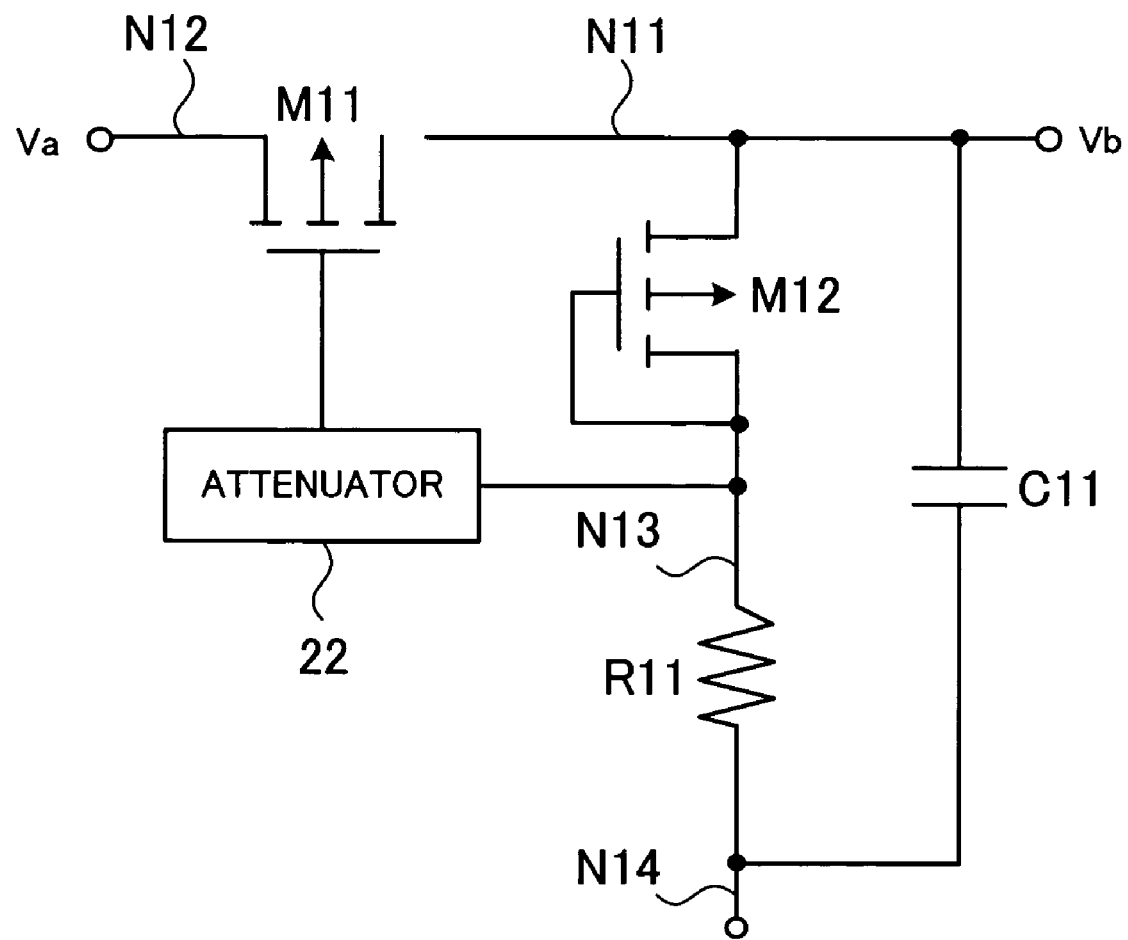
FIG. 9 is a circuit diagram where an attenuator is added to the circuit of FIG. 8.

FIG. 9 is a circuit diagram where an attenuator is added to the circuit of FIG. 8. In the diagram, the same elements as those in FIG. 8 are indicated by the same reference numerals as in FIG. 8 and their descriptions are omitted. As shown in the diagram, the attenuator 22 connected to the gate of the transistor M11 is connected to a connection point of the transistor M12 and the resistor R11.

A voltage lower than that of the node N11 is applied to the node N14 to turn on the transistor 12. By doing so, a current flows from the node N11 to the node N13. The voltage of the node N13 is decreased by the threshold voltage Vthp2 with respect to the voltage of the node N11 by means of the diode-connected transistor M12. The attenuator 22 attenuates the voltage at the gate of the transistor M11 by a voltage ΔVde and outputs the resulting voltage to the node N13. More specifically, the transistor M11 is turned on when the voltage Va of the node N12 is higher than the voltage Vb of the node N11 by a voltage in which the voltage ΔVthp and the voltage ΔVde are added.

When the threshold voltage Vthp1 of the transistor M11 is fairly close to the threshold voltage Vthp2 of the transistor M12, it is feared that a leakage current flows through the transistor M11. Therefore, when a voltage inputted to the gate of the transistor M11 is raised by the attenuator 22, the leakage current can be suppressed and the rectification efficiency can be enhanced.

Operations in FIG. 9 are described by using specific values. Assume that the threshold voltage Vthp1 of the transistor M11 and the threshold voltage Vthp2 of the transistor M12 are 1.1 volts and 1.0 volt, respectively. The attenuator 22 attenuates the voltage at the gate of the transistor M11 by a voltage of 0.1 volt and outputs the resulting voltage to the node N13. Also, assume that the voltage Vb is 2 volts. Accordingly, the voltage of the node N13 is determined to be 1.0 volt by the transistor M12. To the gate of the transistor M11, a voltage of 1.1 volts is inputted by means of the attenuator 22.

When the voltage Va of the node N12 is equal to or more than 2.2 volts, a positive charge flows from the node N12 to the node N11. Therefore, the node N12 serves as the source. Since a voltage of 1.1 volts is inputted to the gate of the transistor M11, a potential difference between the node N12 and the gate of the transistor M11 is equal to or more than 1.1 volts. As a result, the transistor M11 is turned on and a current is allowed to flow from the node N12 to the node N11.

On the other hand, when the voltage Va is from 2.2 to 2 volts, the potential difference between the node N12 and the gate of the transistor M11 is lower than the threshold voltage Vthp1 of 1.1 volts. Therefore, the transistor M11 is turned off. Further, when the voltage Va is lower than 2 volts, the positive charge flows from the node N11 to the node N12. Therefore, the node N11 serves as the source. With respect to a voltage at the node 11 of 2 volts, a voltage of 1.1 volts is inputted to the gate of the transistor M11 by the transistor M12 and the attenuator 22. Therefore, the transistor M11 is in an off-state.

As described above, in the case of using no attenuator 22, the transistor M12 is turned on when the voltage of the node N12 is higher than that of the node N11 by a voltage of 0.1 volt or more. On the other hand, in the case of using the attenuator 22 of FIG. 9, the transistor M12 is turned on when the voltage of the node N12 is higher than that of the node N11 by a voltage of 0.2 volt or more by means of the attenuator 22. More specifically, when the attenuator 22 raises a voltage inputted to the gate of the transistor M11, a threshold voltage that turns on the transistor M11 can be increased.

When using the attenuator 22, the transistors M11 and M12 can be formed into one semiconductor integrated circuit so as to have the same threshold voltage. This is because that the attenuator 22 can determine the threshold voltage that turns on the transistor M11. This leads to facilitation of the design and the manufacture.

The attenuator 22 is described in detail.

Figure 10:
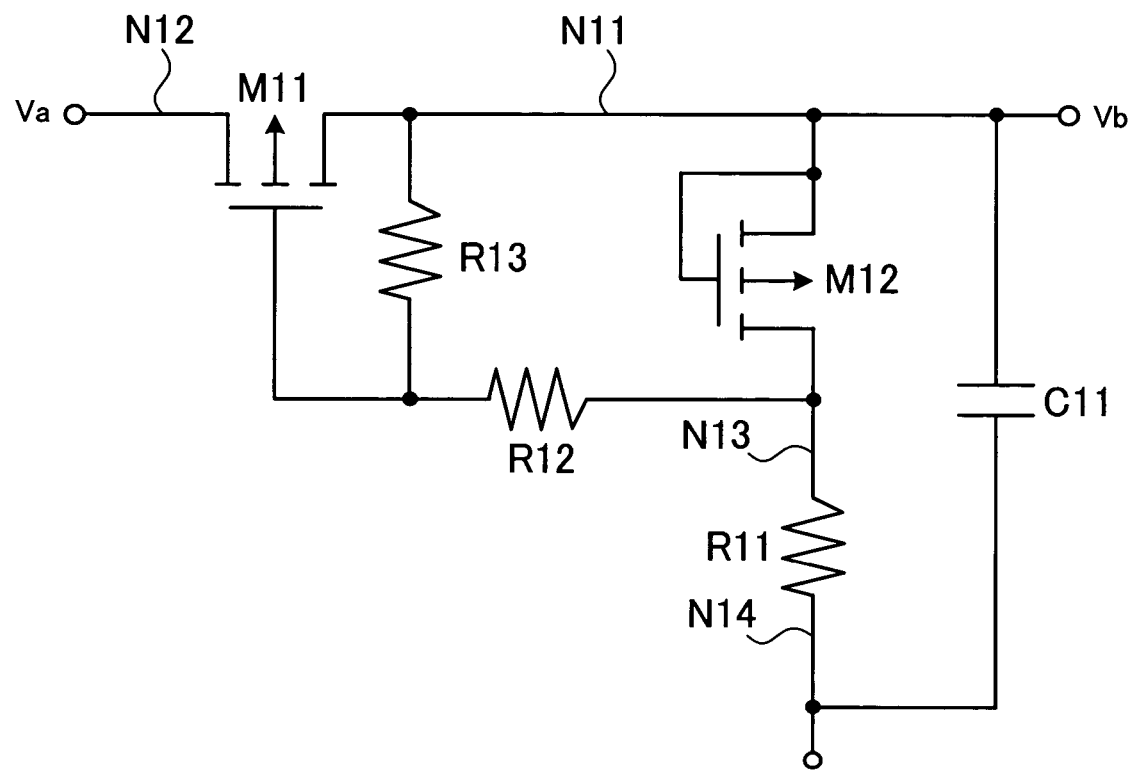
FIG. 10 is a detailed circuit diagram of the attenuator of FIG. 9.

FIG. 10 is a detailed circuit diagram of an attenuator of FIG. 9. In the diagram, the same elements as those in FIG. 9 are indicated by the same reference numerals as in FIG. 9 and their descriptions are omitted. As shown in the diagram, a resistor R12 is connected between the node N13 and the gate of the transistor M11. Further, a resistor R13 is connected between the gate of the transistor M11 and the node N11. The resistors R12 and R13 correspond to the attenuator 22 of FIG. 9.

A current scarcely flows through the gate of the transistor M11. Therefore, the voltage at the gate of the transistor M11 is determined by a resistance ratio between the resistors R12 and R13. For example, in an example of the numerical values described above, the voltage of the node N13 is 1.0 volt and the voltage of the node N11 is 2 volts. Accordingly, the resistance values of the resistors R12 and R13 may be determined such that the voltage at the gate of the transistor M11 becomes 1.1 volts.

By thus dividing the voltage between the node N11 and the node N13 by the resistors R12 and R13, the attenuator 22 can be readily configured. Therefore, the rectifier circuit is readily designed and manufactured.

A relationship among the voltage Va inputted, the rectified voltage Vb and the resistors R12 and R13 is described below.

Figure 11:
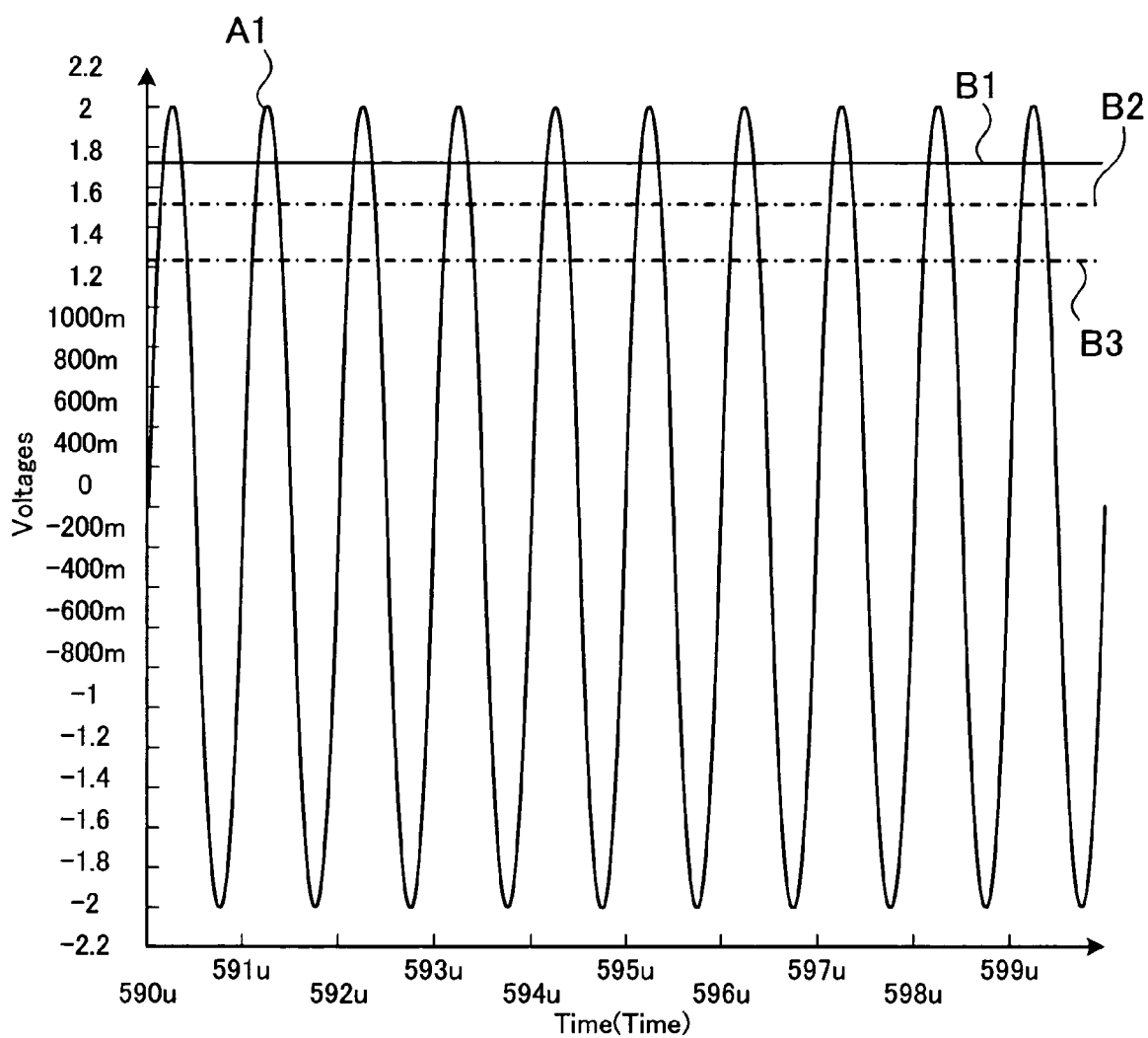
FIG. 11 is a diagram showing rectification results.

FIG. 11 is a diagram showing rectification results. The diagram shows a waveform A1 of the voltage Va inputted between the nodes N12 and N14 of FIG. 10. Further, the diagram also shows waveforms B1 to B3 of the voltage Vb outputted from between the nodes N11 and N14. The waveform B1 shows one formed when a resistance ratio between the resistors R12 and R13 is 1:9. The waveform B2 shows one formed when a resistance ratio between the resistors R12 and R13 is 5:5. The waveform B3 shows one formed when a resistance ratio between the resistors R12 and R13 is 10:0.

As shown in the waveforms B1 to B3, as a resistance ratio of the resistor 12 to the resistor 13 is smaller, the voltage value of the voltage Vb is more increased. More specifically, as a voltage inputted to the gate of the transistor M11 is closer to the threshold voltage Vthp1, the threshold voltage that turns on the transistor M11 is more reduced. As a result, the conduction loss is reduced, and the voltage Vb is increased.

When the rectifier circuit is applied to an IC card or an ID tag, the voltage Va inputted is extremely reduced depending on the distance between the card or the tag and the reader/writer that supplies power. In this case, in the rectifier circuits shown in FIGS. 9 and 10, the threshold voltage that turns on the transistor M11 is increased by the attenuator 22 and therefore, the voltage Va cannot be rectified in some cases. Accordingly, when the voltage Va inputted is small, the attenuator 22 is inactivated to allow the voltage of the node N13 to be directly inputted to the gate of the transistor M11.

Figure 12:
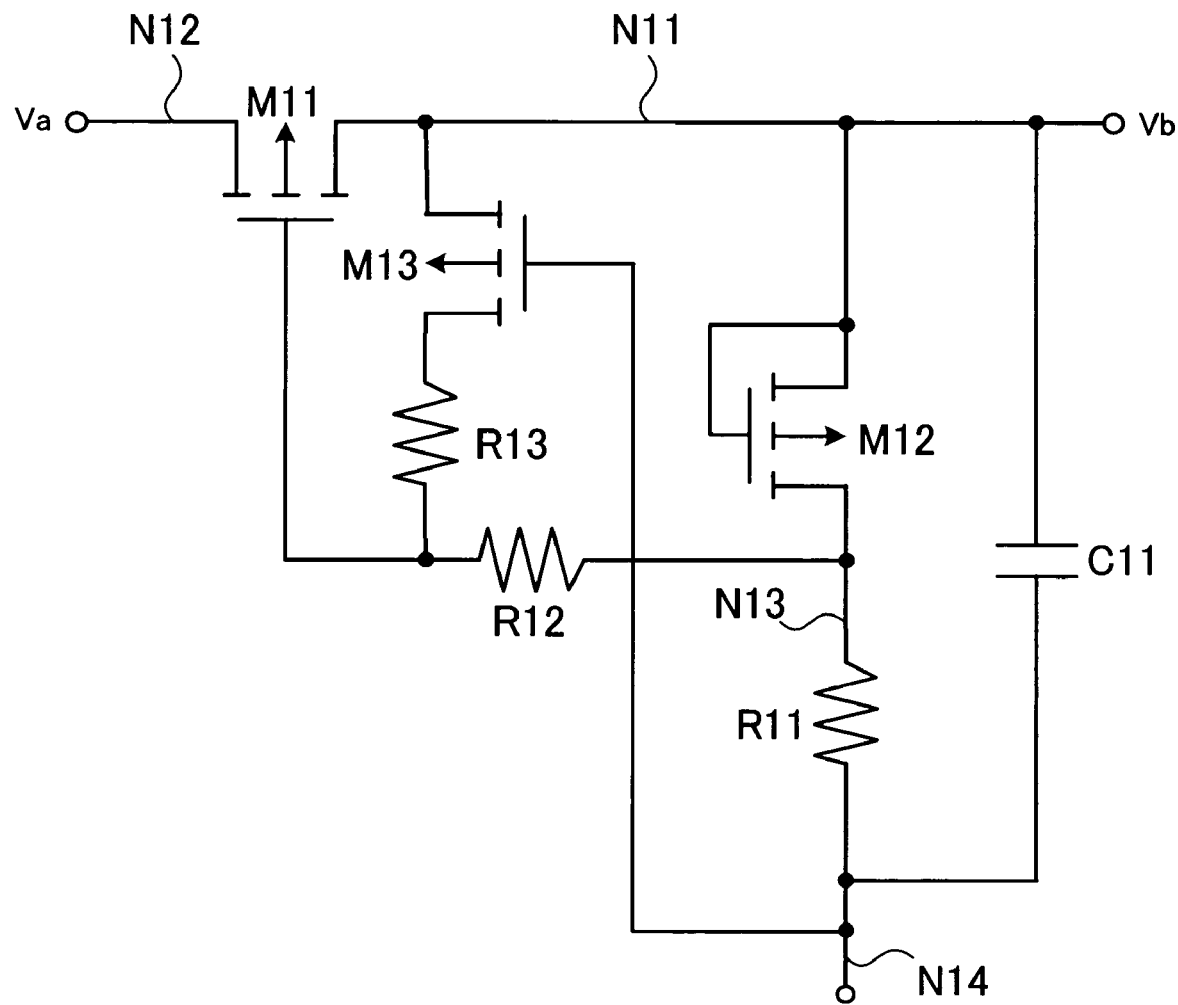
FIG. 12 is a diagram of a circuit for controlling an attenuator.

FIG. 12 is a diagram of a circuit for controlling an attenuator. In the diagram, the same elements as those in FIG. 10 are indicated by the same reference numerals as in FIG. 10 and their descriptions are omitted. As shown in the diagram, a PMOS transistor M13 is connected between the node N11 and the resistor R13. The gate of the transistor M13 is connected to the node N14.

A voltage proportional to the voltage Va is inputted to the node N14. When the voltage Va is reduced to a voltage that turns off the transistor M11, the transistor M13 is turned off to thereby cut off the connection between the resistor R13 and the node N11. More specifically, when the voltage Va is reduced to a voltage that turns off the transistor M1, the threshold voltage Vthp2 of the diode-connected transistor M12 is inputted to the gate of the transistor M11 without the attenuation. As a result, the threshold voltage that turns on the transistor M11 is reduced. Thus, the voltage Va inputted can be rectified even if it is reduced. In addition, a communicable range of IC cards or ID tags can be widened.

Rectifiers to which the rectifier circuits shown in FIGS. 1 to 5, 7 to 10 and 12 are applied are described below.

Figure 13:
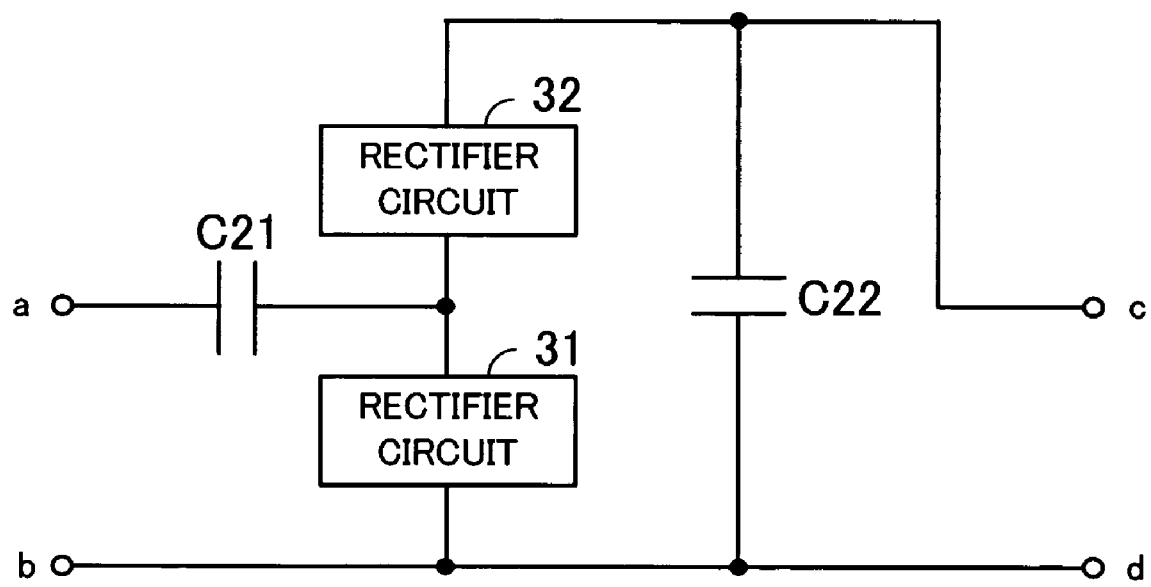
FIG. 13 is a circuit diagram of a half-wave double voltage rectifier to which the rectifier circuits according to the first and second embodiments of the present invention are applied.

FIG. 13 is a circuit diagram of a half-wave double voltage rectifier to which the rectifier circuits according to the first and second embodiments of the present invention are applied. As shown in the diagram, rectifier circuits 31 and 32 are connected in series. A capacitor C21 is connected between an input terminal (a) and a connection point of the rectifier circuits 31 and 32. An input terminal (b) and an output terminal (d) are common, and a capacitor C22 is connected between the output terminals (c) and (d).

The rectifier circuit 31 is one according to the first embodiment of the present invention, shown in FIGS. 1 to 5. The rectifier circuit 32 is one according to the second embodiment of the present invention, shown in FIGS. 7 to 10 and 12. The rectifier circuit 31 allows a current to flow when the voltage of the input terminal (a) is lower than that of the input terminal (b), and thereby charging the capacitor C21. The rectifier circuit 32 allows a current to flow when the voltage of the input terminal (a) is higher than that of the output terminal (c), and thereby charging the capacitor C22 with a voltage charged in the capacitor C21. As a result, a voltage which is twice as much as that between the input terminals (a) and (b) is outputted between the output terminals (c) and (d).

As described above, when the rectifier circuits according to the first and second embodiments of the present invention are applied to the half-wave double voltage rectifier, the conduction loss due to the threshold voltage can be reduced. Further, even if a small voltage is inputted, the voltage can be rectified.

Figure 14:
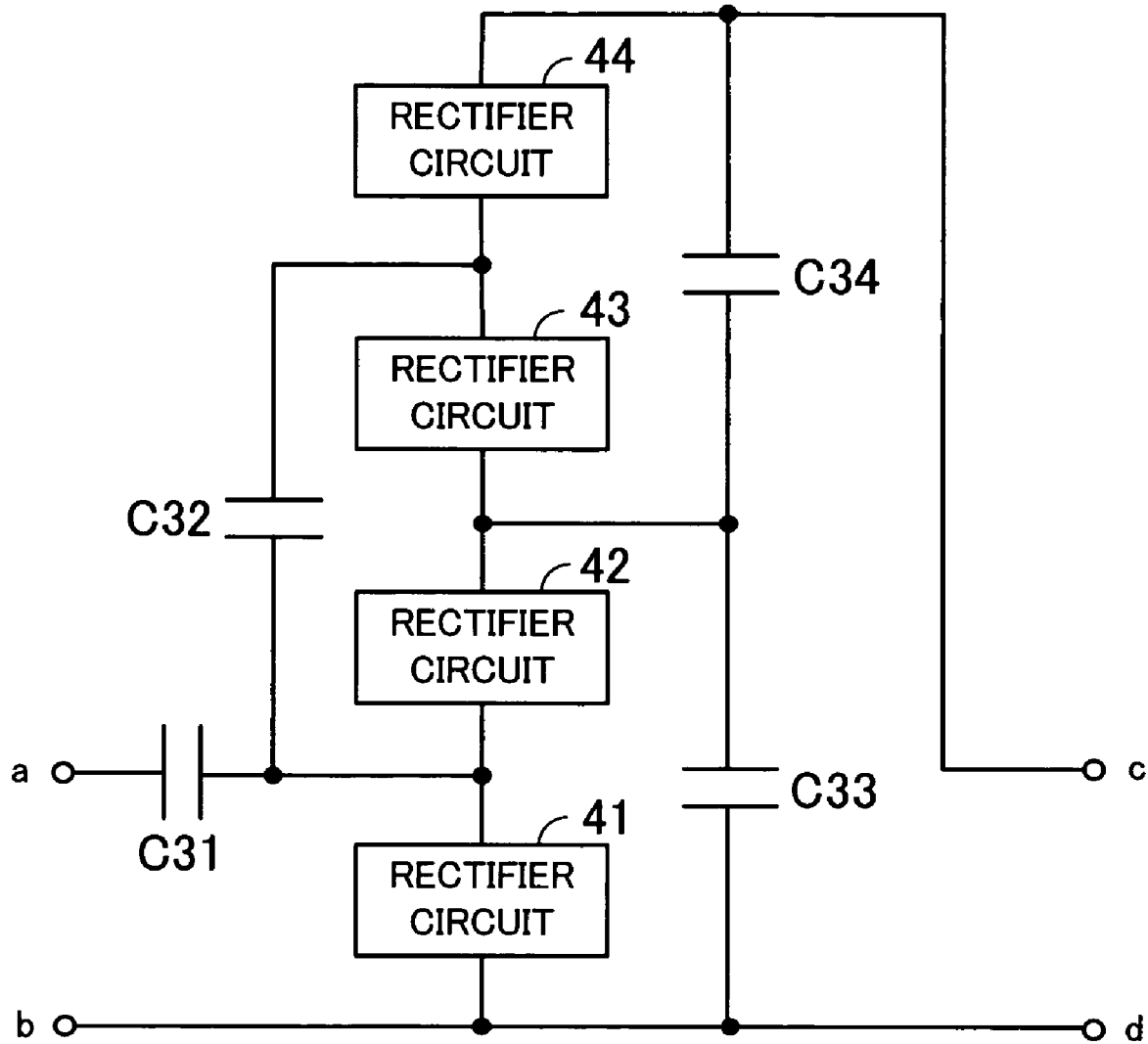
FIG. 14 is a circuit diagram of a half-wave quadruple voltage rectifier to which rectifier circuits according to the first and second embodiments of the present invention are applied.

FIG. 14 is a circuit diagram of a half-wave quadruple voltage rectifier to which the rectifier circuits according to the first and second embodiments of the present invention are applied. As shown in the diagram, rectifier circuits 41 and 42 are connected in series. A capacitor C31 is connected between an input terminal (a) and a connection point of the rectifier circuits 41 and 42. An input terminal (b) and an output terminal (d) are common, and a capacitor C33 is connected in parallel between the rectifier circuits 41 and 42.

Rectifier circuits 43 and 44 are connected in series to the rectifier circuit 42. A capacitor C32 is connected between the capacitor C31 and the connection point of the rectifier circuits 43 and 44. A capacitor C34 that is connected in series to a capacitor C33 is connected in parallel between the rectifier circuits 43 and 44.

A rectifier of FIG. 14 configured by the rectifier circuits 41 and 42 and the capacitors C31 and C33 corresponds to the rectifier of FIG. 13. A rectifier of FIG. 14 configured by the rectifier circuits 43 and 44 and the capacitors C32 and C34 corresponds to the rectifier of FIG. 13. In FIG. 14, a negative pole-side output of the rectifier configured by the rectifier circuits 43 and 44 and the capacitors C32 and C34 is connected in series to a positive pole-side output of the rectifier configured by the rectifier circuits 41 and 42 and the capacitors C31 and C33. Therefore, a voltage which is four times as much as that between the input terminals (a) and (b) is outputted between the output terminals (c) and (d).

As described above, when the rectifier circuits according to the first and second embodiments of the present invention are applied to the half-wave quadruple voltage rectifier, the conduction loss due to the threshold voltage can be reduced. Further, even if a small voltage is inputted, the voltage can be rectified.

Figure 15:
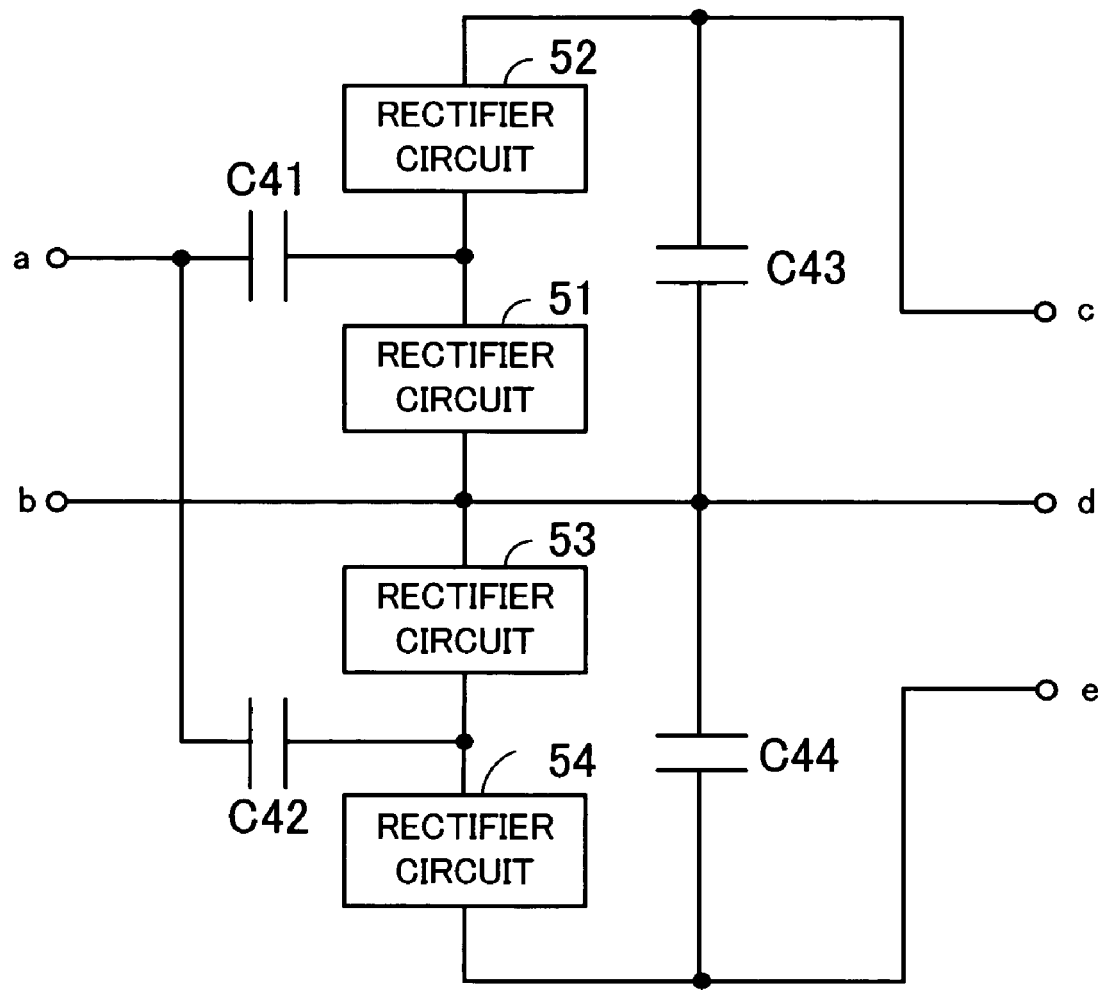
FIG. 15 is a circuit diagram of a bipolar rectifier to which the rectifier circuits according to the first and second embodiments of the present invention are applied.

FIG. 15 is a circuit diagram of a bipolar rectifier to which the rectifier circuits according to the first and second embodiments of the present invention are applied. As shown in the diagram, rectifier circuits 51 and 52 are connected in series. A capacitor C41 is connected between an input terminal (a) and a connection point of the rectifier circuits 51 and 52. An input terminal (b) and an output terminal (d) are common, and a capacitor C43 is connected in parallel between the output terminals (c) and (d).

Rectifier circuits 53 and 54 are connected in series to the rectifier circuit 51. A capacitor C42 is connected between the input terminal (a) and the connection point of the rectifier circuits 53 and 54. A capacitor C44 is connected in parallel between the output terminals (d) and (e).

A rectifier of FIG. 15 configured by the rectifier circuits 51 and 52 and the capacitors C41 and C43 corresponds to the rectifier of FIG. 13. A rectifier of FIG. 15 configured by the rectifier circuits 53 and 54 and the capacitors C42 and C44 corresponds to the rectifier of FIG. 13. In FIG. 15, a negative pole-side output of the rectifier configured by the rectifier circuits 53 and 54 and the capacitors C42 and C44 is connected in series to a negative pole-side output of the rectifier configured by the rectifier circuits 51 and 52 and the capacitors C41 and C43. Therefore, a positive voltage which is twice as much as that between the input terminals (a) and (b) is outputted to the output terminal (c). Further, a negative voltage which is twice as much as that between the input terminals (a) and (b) is outputted to the output terminal (e).

As described above, when the rectifier circuits according to the first and second embodiments of the present invention are applied to the bipolar rectifier, the conduction loss due to the threshold voltage can be reduced. Further, even if a small voltage is inputted, the voltage can be rectified.

In FIGS. 13 and 14, the half-wave double voltage rectifier and the half-wave quadruple voltage rectifier are described. Of course, the rectifier circuits according to the first and second embodiments of the present invention can be applied to a half-wave n-times voltage (n is a positive integer) rectifier.

In FIG. 15, the bipolar rectifier configured by combining two rectifier circuits is described. Of course, a rectifier with a multiple output structure can also be configured by combining three or more rectifier circuits. For example, a new rectifier may be connected in series to the rectifier configured by the rectifier circuits 51 and 52 and the capacitors C41 and C43, as shown in FIG. 14.

An IC card to which the rectifiers shown in FIGS. 13 to 15 are applied is described.

Figure 16:
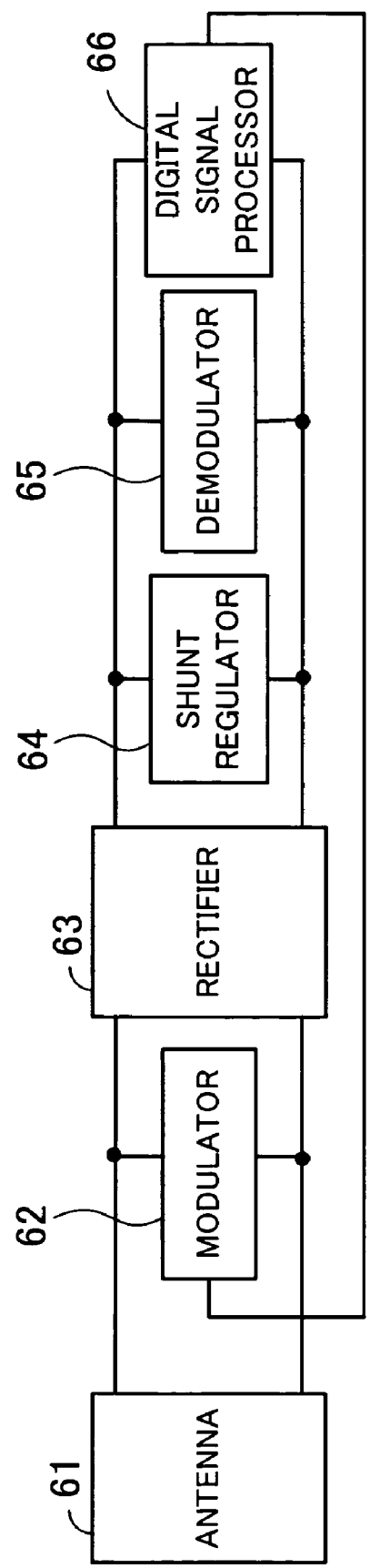
FIG. 16 is a block diagram of an IC card.
Figure 17:
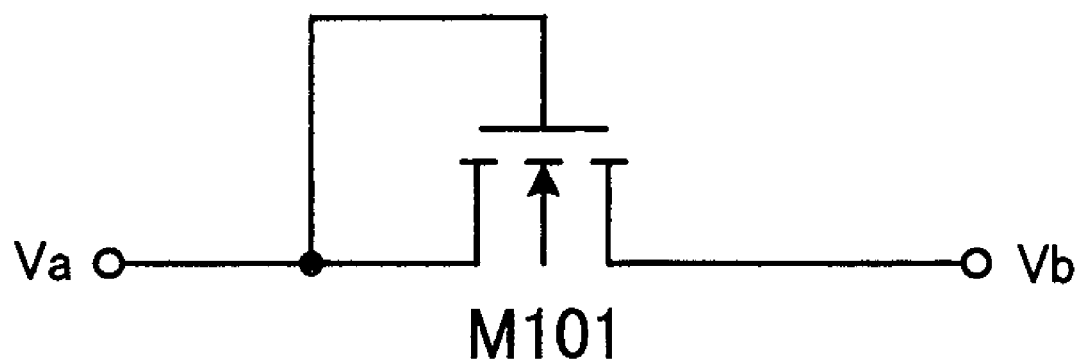
FIG. 17 is a circuit diagram of a diode-connected NMOS transistor.
Figure 18:
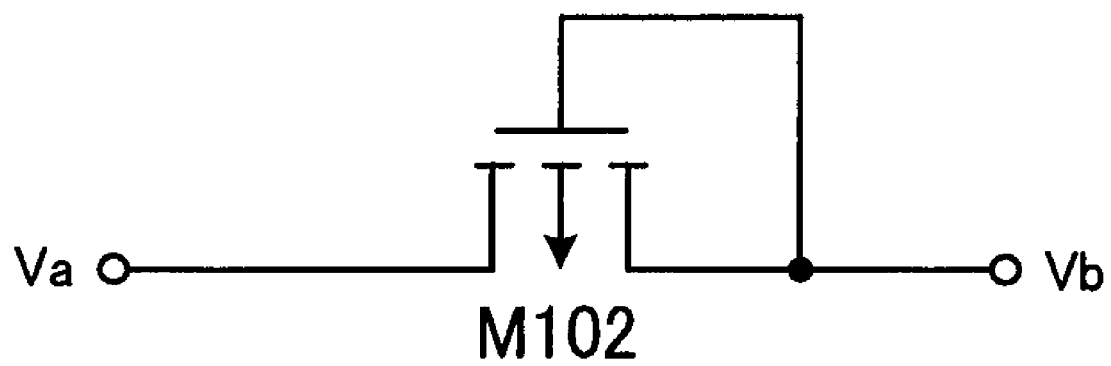
FIG. 18 is a circuit diagram of a diode-connected PMOS transistor.

FIG. 16 is a block diagram of the IC card. As shown in the diagram, the IC card has an antenna 61, modulator 62, rectifier 63, shunt regulator 64, demodulator 65 and digital signal processor 66.

The antenna 61 transmits and receives data to and from a reader/writer. The modulator 62 modulates the data processed by the digital signal processor 66, and transmits the data to the reader/writer through the antenna 61. The rectifiers of FIGS. 13 to 15 are applied to the rectifier 63. The rectifier 63 takes out high-frequency power from high-frequency energy fed by the reader/writer. The rectifier transforms the power into a DC power supply (DC voltage) and outputs the power supply to the modulator 62, the shunt regulator 64, the demodulator 65 and the digital signal processor 66. The shunt regulator 64 controls the power supply voltage to be constant. The digital signal processor 66 transmits and receives the data to and from the reader/writer and performs a predetermined digital processing on the data.

The power (voltage) received by the antenna 61 varies depending on a distance between the antenna and the reader/writer. Even if the distance between the IC card and the reader/writer is far and the voltage taken out from the antenna 61 is small, the voltage can be sufficiently rectified because the threshold voltage in the rectifier circuit of the rectifier 63 is small. Thus, when the high-frequency power is taken out from the high-frequency energy and transformed into the DC power supply, conversion efficiency of the electric power can be improved.

In the above instance, a case is described where the rectifiers shown in FIGS. 13 to 15 are applied to the IC card. The rectifiers can be applied also to a device having no its own power supply such as an ID tag.

In the first and second embodiments, the transistors M1, M2, M11 and M12 are configured using the MOS transistor (MOS-FET). However, these transistors can also be configured using a MES (Metal semiconductor)-FET, a MIS (Metal Insulator Silicon)-FET and a bipolar transistor.

In the rectifier circuit of the present invention, the threshold voltage of the current that starts flowing between the source and drain of the transistor is reduced not by a process step but by the voltage near the threshold voltage outputted to the gate of the transistor. As a result, the cost and the variation in devices can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A rectifier circuit for rectifying a voltage, comprising:
   a first transistor including a first node and a second node, the first node serving as a drain and source connected to a first terminal, the second node serving as a drain and source connected to a second terminal, the first terminal receiving the voltage, the second terminal outputting a rectified voltage; and
   a second transistor including a source connected to the second node, and a gate and drain connected to a gate of the first transistor,
   wherein a bias voltage is inputted to the gate of the second transistor so that the second transistor is always in on state.

2. The rectifier circuit according to claim 1, wherein the first transistor has a greater threshold voltage than the second transistor.

3. A half-wave n-times voltage rectifier for rectifying a voltage to a half-wave n-times voltage, comprising:
   a rectifier circuit for rectifying a voltage, which includes a first transistor and a second transistor, wherein:
   the first transistor includes a first node and a second node, the first node serving as a drain and source connected to a first terminal, the second node serving as a drain and source connected to a second terminal, the first terminal receiving the voltage, the second terminal outputting a rectified voltage;
   the second transistor including a source connected to the second node, and a gate and drain connected to a gate of the first transistor; and
   a bias voltage is inputted to the gate of the second transistor so that the second transistor is always in on state.

4. A bipolar n-times voltage rectifier for rectifying a voltage to a half-wave n- times voltage, comprising:
   a rectifier circuit for rectifying a voltage, which includes a first transistor and a second transistor, wherein:
   the first transistor includes a first node and a second node, the first node serving as a drain and source connected to a first terminal, the second node serving as a drain and source connected to a second terminal, the first terminal receiving the voltage, the second terminal outputting a rectified voltage;
   the second transistor including a source connected to the second node, and a gate and drain connected to a gate of the first transistor; and
   a bias voltage is inputted to the gate of the second transistor so that the second transistor is always in on state.

5. An electronic device to which power is fed by radio waves to allow operation, comprising:
   a rectifier circuit for rectifying a voltage, which includes a first transistor and a second transistor, wherein:
   the first transistor includes a first node and a second node, the first node serving as a drain and source connected to a first terminal, the second node serving as a drain and source connected to a second terminal, the first terminal receiving the voltage, the second terminal outputting a rectified voltage;
   the second transistor including a source connected to the second node, and a gate and drain connected to a gate of the first transistor; and
   a bias voltage is inputted to the gate of the second transistor so that the second transistor is always in on state.

* * * * *